United States Patent
Ho et al.

(10) Patent No.: US 8,924,819 B2
(45) Date of Patent: Dec. 30, 2014

(54) MEMORY DEVICE AND OPERATION METHOD THEREOF

(75) Inventors: Wen-Chiao Ho, Hsinchu (TW); Chin-Hung Chang, Hsinchu (TW); Shuo-Nan Hung, Hsinchu (TW); Chun-Hsiung Hung, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 1035 days.

(21) Appl. No.: 12/358,900

(22) Filed: Jan. 23, 2009

(65) Prior Publication Data

US 2010/0192039 A1    Jul. 29, 2010

(51) Int. Cl.
G11C 29/00 (2006.01)
G06F 11/10 (2006.01)
G11C 29/04 (2006.01)

(52) U.S. Cl.
CPC ............ *G06F 11/1072* (2013.01); *G11C 29/00* (2013.01); *G11C 2029/0411* (2013.01)
USPC ....................................................... 714/764

(58) Field of Classification Search
CPC ............ G06F 11/1076; G06F 11/1008; G06F 11/106; H05K 999/99; G11C 2029/0411
USPC ....................................................... 714/764
See application file for complete search history.

(56) References Cited

U.S. PATENT DOCUMENTS

| | | | | |
|---|---|---|---|---|
| 5,127,014 A | * | 6/1992 | Raynham | 714/754 |
| 5,255,270 A | * | 10/1993 | Yanai et al. | 714/710 |
| 6,163,871 A | * | 12/2000 | Yang | 714/769 |
| 6,601,211 B1 | * | 7/2003 | Norman | 714/773 |
| 6,604,214 B1 | * | 8/2003 | Fukushima | 714/746 |
| 8,041,990 B2 | * | 10/2011 | O'Connor et al. | 714/6.22 |
| 8,051,339 B2 | * | 11/2011 | Sung et al. | 714/710 |
| 8,103,940 B2 | * | 1/2012 | Roohparvar et al. | 714/768 |
| 2001/0028523 A1 | * | 10/2001 | Moro et al. | 360/53 |
| 2006/0195651 A1 | * | 8/2006 | Estakhri et al. | 711/103 |
| 2007/0211532 A1 | * | 9/2007 | Gonzalez et al. | 365/185.11 |
| 2007/0271494 A1 | * | 11/2007 | Gorobets | 714/763 |
| 2008/0034269 A1 | * | 2/2008 | Hwang et al. | 714/756 |
| 2008/0109697 A1 | | 5/2008 | Ho et al. | |
| 2008/0163023 A1 | | 7/2008 | Hong et al. | |
| 2008/0168319 A1 | * | 7/2008 | Lee et al. | 714/746 |
| 2009/0031194 A1 | * | 1/2009 | Bellipaddy et al. | 714/764 |
| 2009/0125764 A1 | * | 5/2009 | Sung et al. | 714/721 |
| 2009/0172499 A1 | * | 7/2009 | Olbrich et al. | 714/773 |

FOREIGN PATENT DOCUMENTS

| | | |
|---|---|---|
| CN | 1591687 | 3/2005 |
| TW | 490640 | 6/2002 |

OTHER PUBLICATIONS

"First Office Action of China Counterpart Application", issued on Feb. 24, 2012, p. 1-p. 4.

* cited by examiner

*Primary Examiner* — Albert Decady
*Assistant Examiner* — Enam Ahmed
(74) *Attorney, Agent, or Firm* — J.C. Patents

(57) ABSTRACT

A method for operating a memory device is provided and includes the following steps. A first error correction code is generated according to user data. Then, the user data is written to the memory device. Moreover, the user data in the memory device is read, and a second error correction code is generated according to the read user data. Further, the first and the second error correction codes are written to the memory device.

9 Claims, 5 Drawing Sheets

MEMORY DEVICE AND OPERATION METHOD THEREOF

BACKGROUND OF THE INVENTION

1. Field of the Invention

The present invention generally relates to a method for operating a memory device, in particular, to a method for operating a flash memory.

2. Description of Related Art

The flash memory is capable of repeatedly storing, reading, and erasing data, and the stored data may not disappear when the power is off. Due to the above advantages, the flash memory becomes a non-volatile memory device widely applied in electronic devices such as personal computers, portable computers, and digital cameras. However, after the flash memory is used for a while, some error bits may occur, and further result in data access errors. In view of the above, the conventional art generally adopts an error correction code for error correction.

FIGS. 1A and 1B are respectively flow charts of methods for programming and reading a flash memory by using an error correction code in the conventional art. As shown in FIG. 1A, during the process of programming the flash memory, in the conventional art, after received user data is stored in a register (Steps S111 and S112), the error correction code is generated according to the user data (Step S113), and the user data and the error correction code are written to the flash memory (Step S114). Therefore, referring to FIG. 1B, during the process of reading the flash memory, in the conventional art, after the read error correction code and read data are stored in the register (Steps S121 and S122), the user data is obtained by correcting the read data with the error correction code (Step S123). Accordingly, in the conventional art, the user data can be registered and output (Steps S124 and S125).

It should be noted that, for a multi-level cell (hereinafter referred to as MLC) flash memory, the bit information is recorded by a plurality of different levels of threshold voltages, such that in FIG. 2, for the MLC flash memory, usually a read level RD cannot recognize the bit information due to an overlap distribution 210 of the threshold voltages VT. Further, over-program and charge loss of the memory cell are the main reasons of the threshold voltage offset. The over-program occurs during the process of writing the user data to the flash memory, and the charge losses are increasingly accumulated with the cyclic operation of the memory cell.

In the conventional art, the error correction is performed by using only a single error correction code generated before the user data is written. Thus, for errors occurring due to over-program in the process of writing the user data or due to charge loss after the user data is written, the correctable bit number of the error correction code must be continuously increased to complete the error correction. However, with the increase of the correctable bit number of the error correction code, the conventional art must add hardware facilities to support the complicated and huge error correction code computation. Moreover, the more ECC correcting code in order to have the enough correcting ability will need more silicon area to save them.

SUMMARY OF THE INVENTION

Accordingly, the present invention is directed to a method for operating a memory device, so as to improve the correcting capability of the memory device and reduce the complexity of a hardware facility of the memory device.

The present invention is also directed to another method for operating a memory device, so as to enhance the correcting capability of the memory device.

The present invention is further directed to a memory device with better correcting capability.

A method for operating a memory device is provided and includes the following steps. During the process of controlling the memory device, a first error correction code is generated according to user data. Then, the user data is written to the memory device. Next, the user data in the memory device is read, and a second error correction code is generated according to the read user data. Finally, the first and the second error correction codes are written to the memory device.

Further, another method for operating a memory device is provided. In the method, the memory device stores a first error correction code and a second error correction code. The method for operating the memory device includes reading the first error correction code, the second error correction code, and read data in the memory device; obtaining the temporary data by correcting the read data with the second error correction code; and obtaining the user data by correcting the temporary data with the first error correction code.

In an embodiment of the present invention, the method for operating the memory device further includes storing the read data in a register; updating the read data stored in the register by the temporary data; updating the temporary data stored in the register by the user data; and outputting the user data.

In view of the above, in the present invention, before and after the user data is stored in the memory device, the first and the second error correction codes are respectively generated. Therefore, the stage type correction may be performed on the user data with the first and the second error correction codes, such that a good correcting capability can be achieved by using the first and the second error correction codes with a lower correctable bit number. In other words, compared with the conventional art, the present invention may reduce the complexity of the hardware facility.

A memory device is provided and includes a memory, an error correction circuit and an operation circuit. The error correction circuit is coupled to the memory. The operation circuit is for enabling the error correction circuit to generate a first error correction code according to user data before writing to the memory and generate a second error correction code according to read data from the memory.

In order to make the aforementioned and other objectives, features, and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figures 1A, 1B:
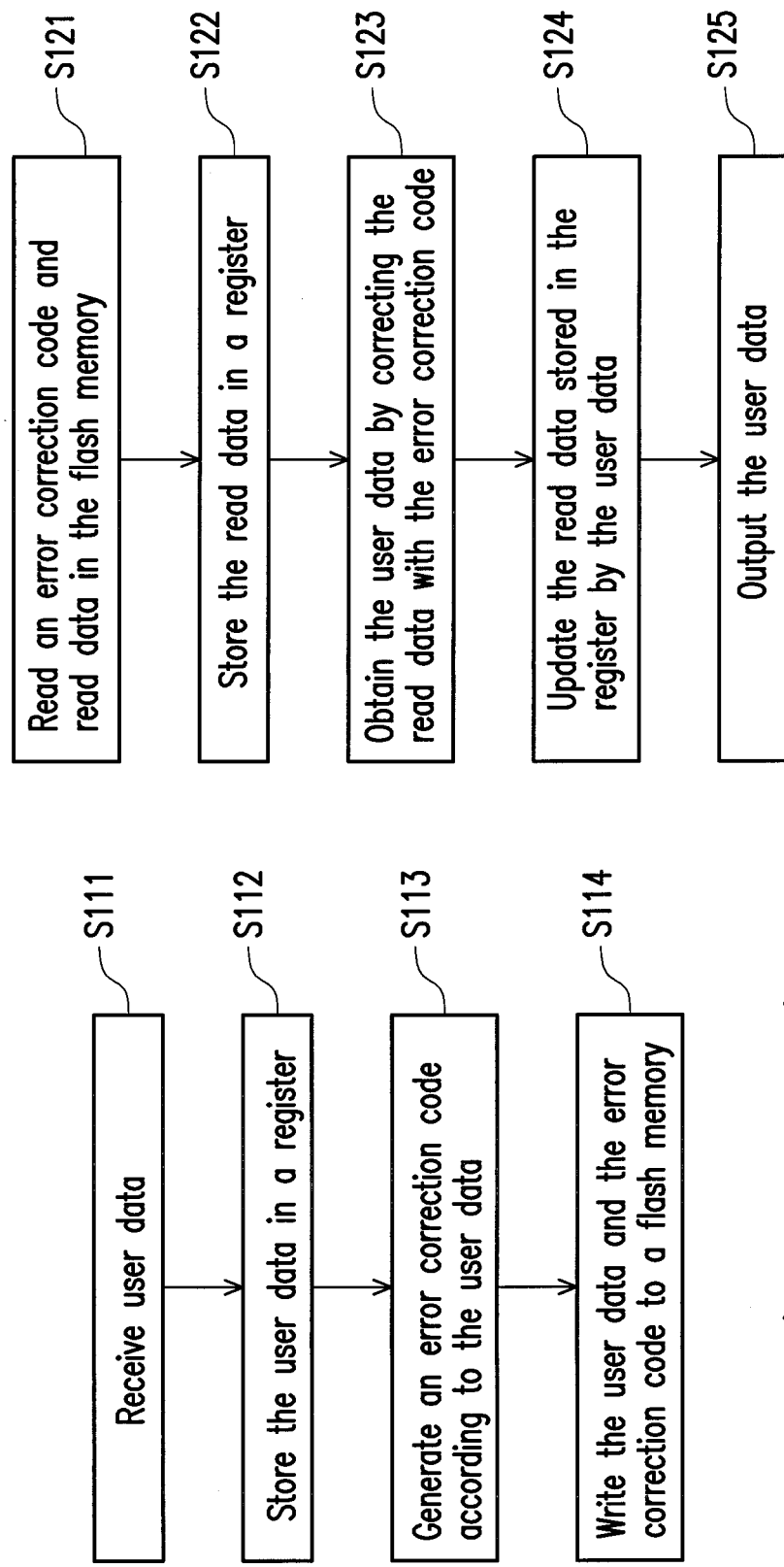
FIG. 1A is a flow chart of a method for programming a flash memory with an error correction code in the conventional art.
FIG. 1B is a flow chart of a method for reading a flash memory with an error correction code in the conventional art.
Figure 2:
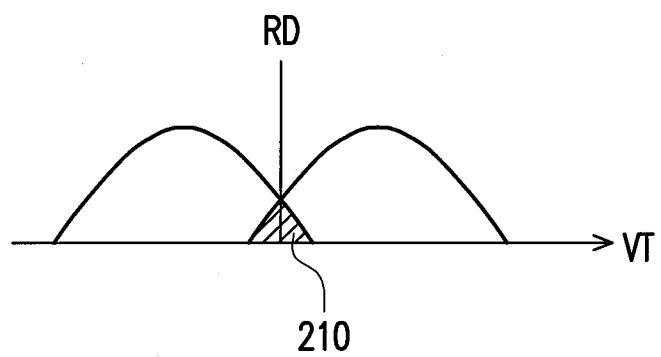
FIG. 2 is a schematic view showing the distribution of a threshold voltage of an MLC flash memory.

Reference will now be made in detail to the present embodiments of the invention, examples of which are illustrated in the accompanying drawings. Wherever possible, the same reference numbers are used in the drawings and the description to refer to the same or like parts.

Figure 3:
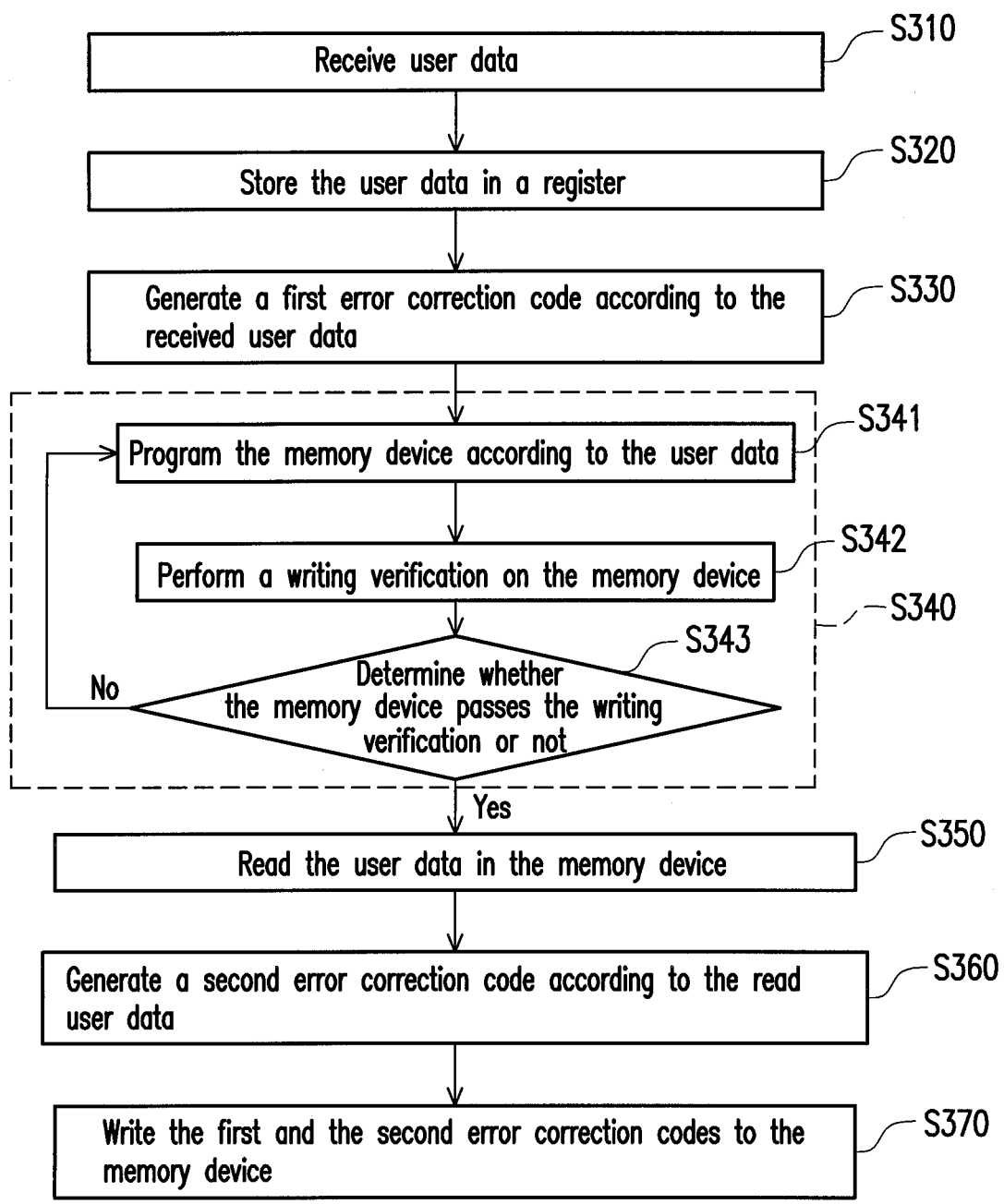
FIG. 3 is a flow chart of a method for operating a memory device according to an embodiment of the present invention.
Figure 4:
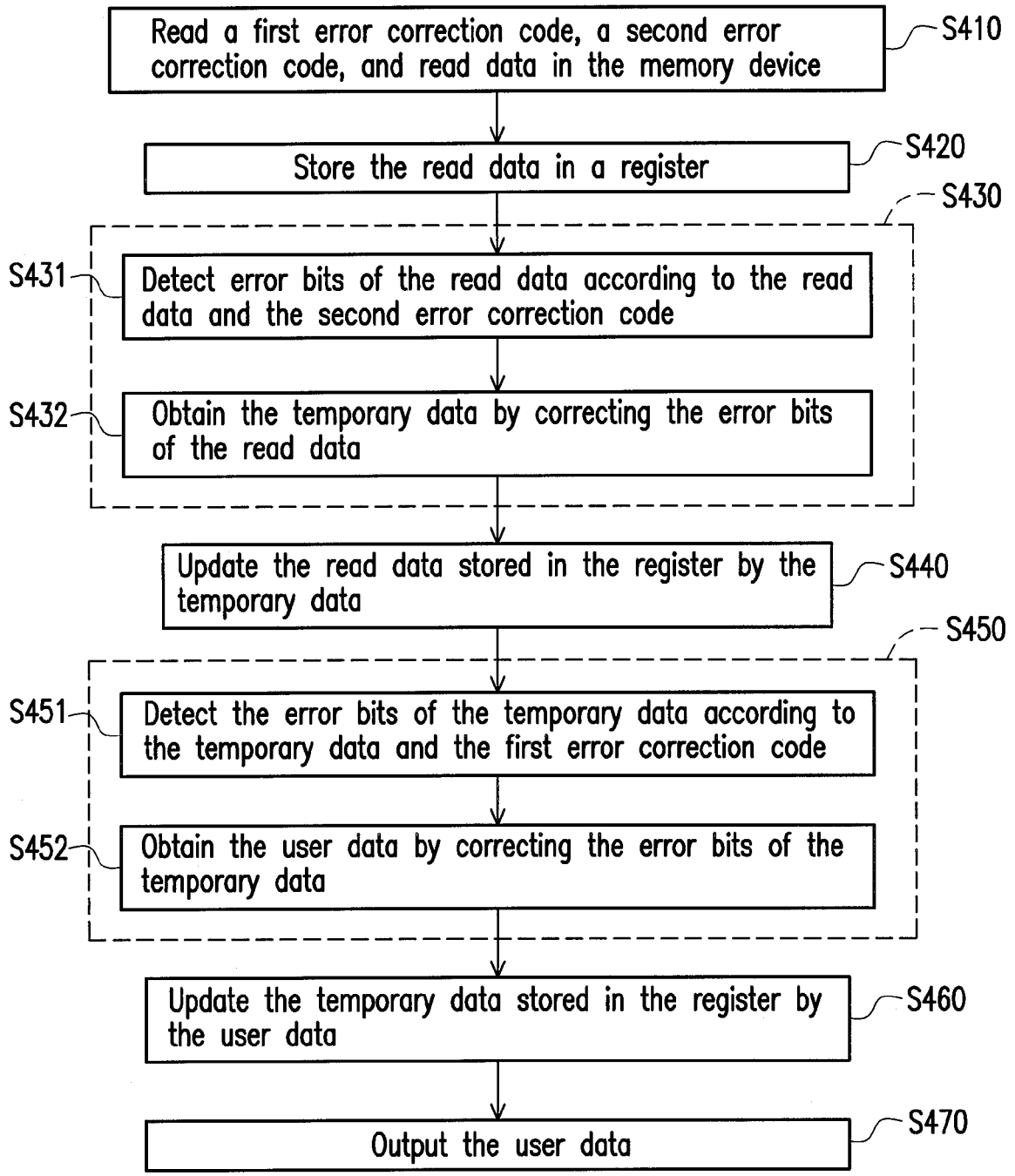
FIG. 4 is a flow chart of a method for operating a memory device according to another embodiment of the present invention.

FIG. 3 is a flow chart of a method for operating a memory device according to an embodiment of the present invention, and FIG. 4 is a flow chart of a method for operating the memory device according to another embodiment of the present invention. In the following, the flow of programming the memory device is mainly described in FIG. 3, and the flow of reading the memory device is mainly described in FIG. 4. In addition, the operating method described in the embodiments of FIGS. 3 and 4 is applicable to an MLC flash memory, and is not intended to limit the present invention.

Referring to FIG. 3, during the process of programming the memory device in this embodiment, as shown in Step S310, user data is received, and in Step S320, the received user data is stored in a register. Next, in Step S330, a first error correction code is generated according to the received user data.

Further, in Step S340, the user data is written to the memory device. Moreover, for the detailed flow of writing the data, firstly, in Step S341, the memory device is programmed according to the user data. Then, in Step S342, a writing verification is performed on the memory device, so as to determine whether a level of a threshold voltage of a programmed memory cell in the memory device satisfies the bit information of the user data or not. Afterward, in Step S343, it is determined whether the memory device passes the writing verification or not. Therefore, when the memory device does not pass the writing verification, Steps S341 to S343 are repeated. On the contrary, when the memory device passes the writing verification, Step S350 is performed.

In Step S350, the user data in the memory device is read. It should be noted that during the process of writing the user data, error bits may occur in the user data due to over-program. Besides, after the user data is written, error bits may occur in the user data due to charge loss. Therefore, the user data read in Step S350 may have error bits, and is thus considered as a batch of read data.

Referring to FIG. 3, after the user data in the memory device is read, in Step S360, a second error correction code is generated according to the read user data. Then, in Step S370, the first and the second error correction codes are written to the memory device. Therefore, the stage type correction may be performed on the user data with the first and the second error correction codes, such that in this embodiment, a good correcting capability can be achieved by using the first and the second error correction codes with a lower correctable bit number.

For example, as shown in FIG. 4, during the process of reading the memory device, firstly, in Step S410, a first error correction code, a second error correction code, and read data in the memory device are read according to the address where the user data is originally stored. It should be noted that the read data defined in Step S350 and Step S410 is actually the user data read from the memory device at different time points. As the reading time points are different, the user data (read data) read in Step S350 may be different from the user data (read data) read in Step S410 due to different degrees of charge loss.

Referring to FIG. 4, in Step S420, the read data is stored in a register, and in Step S430, the temporary data is obtained by correcting the read data with the second error correction code. During the process of correcting the read data, firstly in Step S431, error bits of the read data are detected according to the read data and the second error correction code. Next, in Step S432, the temporary data is obtained by correcting the error bits of the read data. In other words, in this embodiment, a first stage correction is performed on a part of the bit errors generated due to charge loss with the second error correction code.

Afterward, in Step S440, the read data stored in the register is updated by the temporary data, such that the read data is stored in the register. Further, in Step S450, the user data is obtained by correcting the temporary data with the first error correction code. During the process of correcting the temporary data, firstly in Step S451, the error bits of the temporary data are detected according to the temporary data and the first error correction code. Then, in Step S452, the user data is obtained by correcting the error bits of the temporary data.

In other words, in this embodiment, a second stage correction is performed on the bit errors generated due to over-program and charge loss with the first error correction code. Therefore, in Step S460, the temporary data stored in the register is updated by the user data, such that the user data is stored in the register, and in Step S470, the user data is output.

Figure 5:
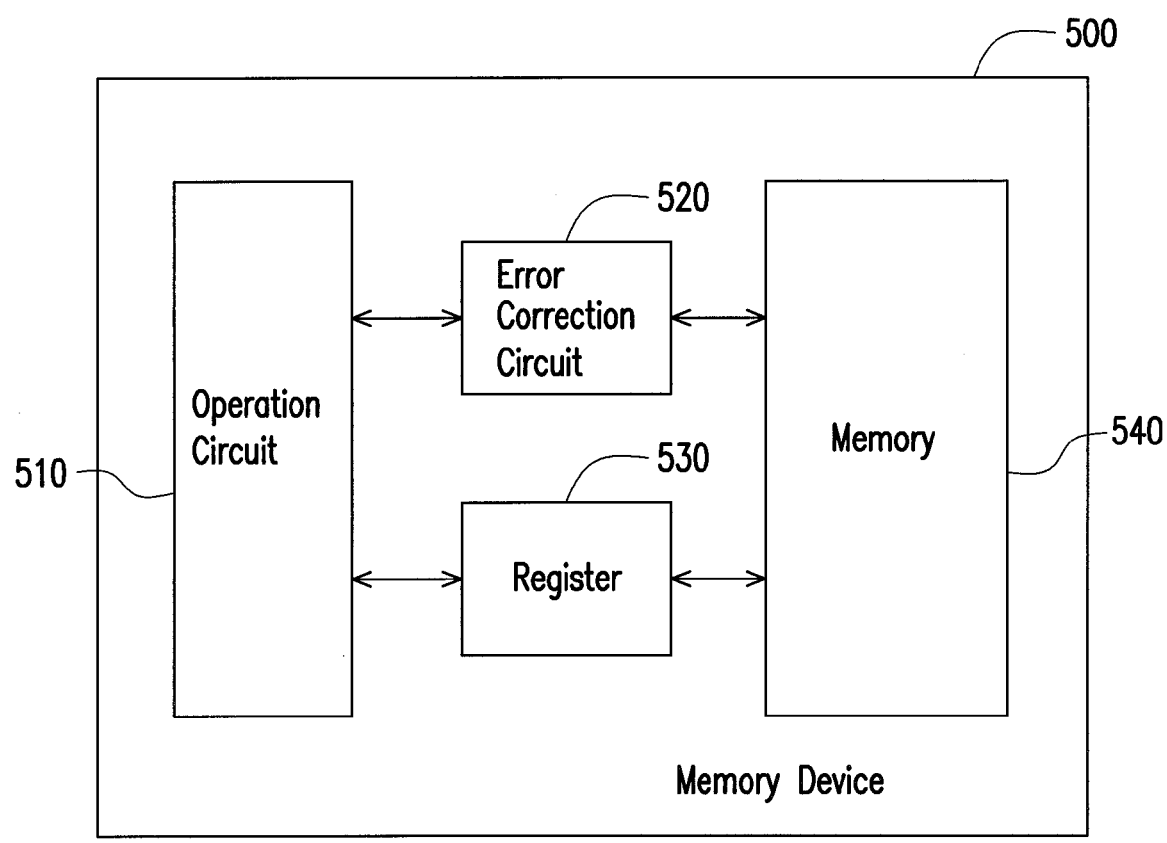
FIG. 5 is a block diagram of a memory device according to an embodiment of the present invention.

FIG. 5 is a block diagram of a memory device according to an embodiment of the present invention. Referring to FIG. 5, the memory device 500 includes an operation circuit 510, a error correction circuit 520, a register 530 and a memory 540. The error correction circuit 520 and the register 530 are coupled to the memory 540. The operation circuit 510 is coupled to the error correction circuit 520 and the register 530.

When the memory device 500 receives user data, the user data is temporarily stored in the register 530, and the operation circuit 510 enables the error correction circuit 520 to generate a first error correction code according to the user data. Then, the user data is written to the memory 540. When the memory 540 passes the writing verification, the user data in the memory 540 is read. It should be noted that the read user data could have error bits due to over-program or/and charge loss, and is thus considered as a batch of read data. The operation circuit 510 enables the error correction circuit 520 again to generate a second error correction code according to the read user data.

During a read operation mode, the error correction circuit 520 read the user data in the memory 540 again. It should be noted that the error bits of the user data read from the memory 540 could be increased due to different degrees of charge loss as time goes by, and thus the present user data from the memory is considered as another batch of read data. Then, the operation circuit 510 obtains the temporary data by correcting the another read data with the second error correction code, and obtains the original user data by correcting the temporary data with the first error correction code, wherein the temporary data and the read data are temporarily stored in the register 530. The other details of this memory device 500 have been described in the above embodiments, which thus will not repeated herein any more.

To sum up, in the present invention, before and after the user data is stored in the memory device, the first and the second error correction codes are respectively generated. Therefore, the stage type correction may be performed on the user data with the first and the second error correction codes, such that a good correcting capability can be achieved by using the first and the second error correction codes with a lower correctable bit number.

For example, if the correctable bit numbers of the first and the second error correction codes are respectively N and M bits, in which N and M are positive integers, and if N is larger than M, the present invention will need only the determined error-correct-algorithm whose ability is N bits, relatively, if M is larger than N, we will need the error-correct-algorithm whose ability is M bits. That means we can predetermine the suitable number especially for the silicon characteristic where the error bit will mainly dominated by the phase just passing the write verify or the later period. However, the conventional art will always need the error-correct-algorithm of (N+M) correctable ability in order to provide the correct data for the user. Therefore, compared with the conventional art, the present invention may achieve a good correcting capability without increasing the correctable bit number of the first and the second error correction codes. In other words, the present invention may reduce the complexity of the hardware facility and improve the operating speed of the memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a plurality of non-volatile memory cells, comprising:
   generating a first error correction code according to user data;
   writing the user data to the non-volatile memory cells, wherein the step of writing the user data to the non-volatile memory cells comprises:
   programming the non-volatile memory cells according to the user data;
   performing a writing verification on the non-volatile memory cells;
   determining whether the non-volatile memory cells passes the writing verification or not; and
   repeating the above three steps, when the non-volatile memory cells do not pass the writing verification;
   reading the user data written into the non-volatile memory cells to obtain first read data, and generating a second error correction code according to the first read data; and
   writing the first and the second error correction codes to the non-volatile memory cells.

2. The method for operating the non-volatile memory cells according to claim 1, wherein the non-volatile memory cells are a plurality of multi-level cell (MLC).

3. A method for operating a plurality of non-volatile memory cells, comprising:
   generating a first error correction code according to user data;
   writing the user data to the non-volatile memory cells, wherein the step of writing the user data to the non-volatile memory cells comprises:
   programming the non-volatile memory cells according to the user data;
   performing a writing verification on the non-volatile memory cells;
   determining whether the non-volatile memory cells passes the writing verification or not; and
   repeating the above three steps, when the non-volatile memory cells do not pass the writing verification;
   reading the user data written into the non-volatile memory cells to obtain first read data, and generating a second error correction code according to the first read data;
   writing the first error correction code and the second error correction code to the non\-volatile memory cells;
   reading the first error correction code and the second error correction code;
   reading the user data written into the non-volatile memory cells again to obtain second read data;
   obtaining temporary data by correcting the second read data with the second error correction code; and
   obtaining the user data by correcting the temporary data with the first error correction code.

4. The method for operating the non-volatile memory cells according to claim 3, further comprising:
   storing the second read data in a register;
   updating the second read data stored in the register by the temporary data;
   updating the temporary data stored in the register by the user data; and
   outputting the user data.

5. The method for operating the non-volatile memory cells according to claim 3, wherein the step of obtaining the temporary data by correcting the second read data with the second error correction code comprises:
   detecting error bits of the second read data according to the second read data and the second error correction code; and
   obtaining the temporary data by correcting the error bits of the read data.

6. The method for operating the non-volatile memory cells according to claim 3, wherein the step of obtaining the user data by correcting the temporary data with the first error correction code comprises:
   detecting error bits of the temporary data according to the temporary data and the first error correction code; and
   obtaining the user data by correcting the error bits of the temporary data.

7. The method for operating the non-volatile memory cells according to claim 3, wherein the non-volatile memory cells are a plurality of multi-level cell (MLC).

8. A memory device, comprising:
   a plurality of non-volatile memory cells;
   an error correction circuit coupled to the non-volatile memory cells; and
   an operation circuit for enabling the error correction circuit to generate a first error correction code according to user data before being written into the non-volatile memory cells, wherein the error correction circuit reads the user data written into the non-volatile memory cells to obtain first read data and generate a second error correction code according to the first read data, the error correction circuit reads the user data written into the non-volatile memory cells again to obtain second read data, and the error correction circuit corrects the second read data with the first and the second error correction codes so as to obtain the user data, wherein the user data is written to the non-volatile memory cells by:
   programming the non-volatile memory cells according to the user data;
   performing a writing verification on the non-volatile memory cells;
   determining whether the non-volatile memory cells passes the writing verification or not; and repeating the above three steps, when the non-volatile memory cells does not pass the writing verification.

9. The memory device according to claim 8, wherein the operation circuit in a read operation mode enables the error correction circuit to:
   obtain temporary data by correcting the second read data with the second error correction code; and
   obtain the user data by correcting the temporary data with the first error correction code.

\* \* \* \* \*